(12) United States Patent
Niemann

(10) Patent No.: US 8,836,319 B2
(45) Date of Patent: Sep. 16, 2014

(54) METHOD FOR MEASURING THE CURRENT LEVEL OF AN ALTERNATING CURRENT

(75) Inventor: Hartmut Niemann, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 962 days.

(21) Appl. No.: 12/915,120

(22) Filed: Oct. 29, 2010

(65) Prior Publication Data

US 2012/0105052 A1    May 3, 2012

(51) Int. Cl.
*G01R 15/18* (2006.01)
*G01R 31/02* (2006.01)
*G01R 1/44* (2006.01)
*G01R 35/00* (2006.01)

(52) U.S. Cl.
CPC ............ *G01R 15/181* (2013.01); *G01R 31/024* (2013.01); *G01R 1/44* (2013.01); *G01R 35/00* (2013.01)
USPC ....................................................... 324/127

(58) Field of Classification Search
CPC ........ G01R 15/181; G01R 35/00; G01R 1/44; G01R 31/024
See application file for complete search history.

(56) References Cited

U.S. PATENT DOCUMENTS

| 5,424,513 | A | * | 6/1995 | Gmeiner et al. | ............... | 219/492 |
| 5,461,309 | A | | 10/1995 | Baudart | | |
| 6,239,589 | B1 | * | 5/2001 | Windsheimer | ................ | 324/142 |
| 2007/0139032 | A1 | | 6/2007 | Dupuis et al. | | |
| 2007/0290675 | A1 | * | 12/2007 | Birkle et al. | ................... | 324/127 |

FOREIGN PATENT DOCUMENTS

| DE | 148681 A | 6/1981 | |
| DE | 69919978 T2 | 9/2005 | |
| EP | 0543181 A1 | 5/1993 | |
| EP | 2149794 A2 * | 2/2010 | ............. G01R 15/18 |
| WO | 0014551 A1 | 3/2000 | |

OTHER PUBLICATIONS

Dupraz, J. P. et al.: "Rogowski Coil: Exceptional Current Measurement Tool for Almost Any Application"; in Power Engineering Society General Meeting; pp. 1-8; ISBN 978-1-4244-1296-9; XP031118756; Jul. 1, 2007.

\* cited by examiner

*Primary Examiner* — Jermele M Hollington
(74) *Attorney, Agent, or Firm* — Laurence A. Greenberg; Werner H. Stemer; Ralph E. Locher

(57) ABSTRACT

A method for measuring a current level of an alternating current uses a current transformer having a measurement winding and a test winding. The resistance of the test winding is measured, the temperature of the test winding and therefore of the measurement winding is determined therefrom, and a value for a current level measured on the measurement winding is corrected using that temperature.

14 Claims, 1 Drawing Sheet

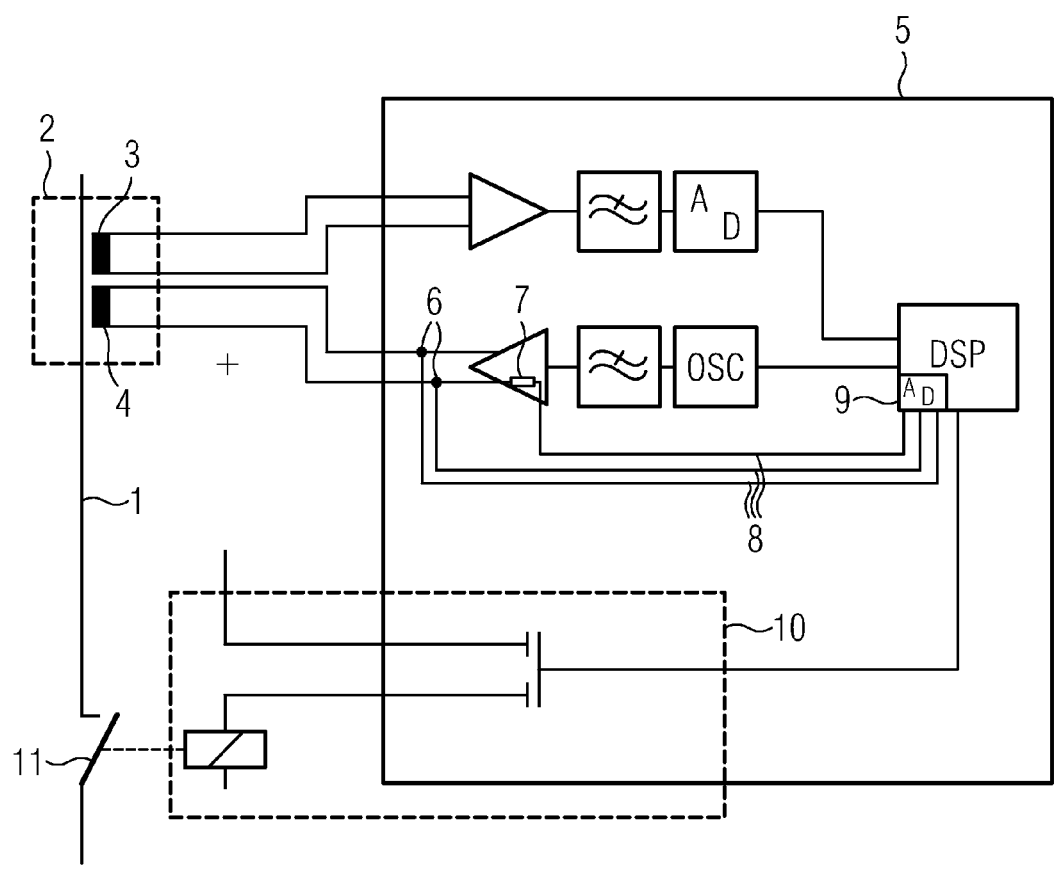

METHOD FOR MEASURING THE CURRENT LEVEL OF AN ALTERNATING CURRENT

BACKGROUND OF THE INVENTION

Field of the Invention

The invention relates to a method for measuring a current level of an alternating current through the use of a current transformer which has a measurement winding and a test winding.

It is known for an alternating current to be introduced into a test winding in order to make it possible to identify component failure, for example a line discontinuity.

The structure of such a current transformer corresponds to that of a Rogowski coil, which is known per se. In a Rogowski coil, the current level measured in the measurement winding is corrected in such a way that it no longer depends on the ambient temperature of the Rogowski coil.

Reliable compensation for the influence of the temperature is particularly important when the method for measurement of the current level of an alternating current is used in railway technology. There, temperatures which differ widely from one another can be expected, since the same technology is used in different countries and also at different seasons.

SUMMARY OF THE INVENTION

It is accordingly an object of the invention to provide a method for measuring the current level of an alternating current, which overcomes the hereinafore-mentioned disadvantages of the heretofore-known methods of this general type and which uses simple and nevertheless reliable measures to preclude or at least minimize temperature dependency of the measurements carried out on a measurement winding.

With the foregoing and other objects in view there is provided, in accordance with the invention, a method for measuring a current level of an alternating current. The method comprises providing a current transformer having a measurement winding and a test winding, measuring a resistance of the test winding, determining a temperature of the test winding and therefore of the measurement winding from the resistance of the test winding, and correcting a value for a current level measured on the measurement winding using the determined temperature.

The method according to the invention achieves the advantage that simple measures are used to prevent the possibilities of different temperatures influencing the measured current level of the alternating current. Temperature fluctuations which, for example, are very major on a railroad track, are advantageously compensated for.

In accordance with another mode of the invention, by way of example, an alternating current having a current level and a voltage which are measured is fed into the test winding. The resistance is determined therefrom in a known manner and the temperature is determined from the resistance through the use of a known dependency function.

The temperature is therefore determined in a simple manner solely from the measurement of a current level or a voltage. The resistance is determined from the current level and voltage using Ohm's Law, and this resistance is related to the temperature in accordance with the known function. This function can be used to determine the temperature from the resistance.

In accordance with a further mode of the invention, for example, the value for the current level measured on the measurement winding is compared with a threshold value which depends on the determined temperature, with the measured current level then being considered only if the threshold value is exceeded.

If the threshold value is exceeded, an alarm can be triggered, or a switching operation can be carried out.

Before the comparison with a threshold value, the value for the current level can be corrected by a filter function, for example through the use of a bandpass filter.

The use of a threshold value achieves the advantage that the temperature dependency of the current level measured in the measurement winding is reliably compensated for even better while using simple measures. A current level value is always obtained which is not influenced by the temperature. This is particularly advantageous when, as is normally the case in railroad technology, the ambient temperature can fluctuate severely as a function of time and location and, at the same time, the change that this results in, in the current level value, leads to a restriction in the availability of the vehicles, possibly extending to shut down.

In accordance with an added mode of the invention, by way of example, the dependency of the threshold value on the temperature is determined by using a function determined in laboratory measurements. This function can be created in such a way that a temperature dependency of the current level measurement on a current transformer can be reliably compensated for.

In accordance with an additional mode of the invention, by way of example, the change in the threshold value which takes place, for example, on the basis of the function determined in laboratory measurements is carried out in an evaluation unit of a fault current monitoring module.

In accordance with yet another mode of the invention, by way of example, a resistor which is integrated in a fault current monitoring module is used to determine the current level of the current through the test winding.

Both developments achieve the advantage that, apart from the resistor, no additional components which were not previously present are required.

This achieves the advantage that largely existing components are used for fault current monitoring, using the current transformer to detect a fault current in a line.

In accordance with a concomitant mode of the invention, by way of example, the alternating current having a current level which is measured is the feed current or the return current of a rail vehicle.

In order to reliably identify a fault current, the method according to the invention is used to compare the current level of the current which flows through the measurement winding of the current transformer, once this current level has been corrected by a filter function, for example through the use of a bandpass filter, and the temperature dependency has been compensated for, with the threshold value. Overshooting then indicates the existence of a fault current.

By way of example, when the ambient temperature is very low, this threshold value is higher than otherwise in order to prevent an excessive number of fault currents being indicated, which are caused only by weather conditions, when the temperatures on the railroad track are low, in particular in the event of ice formation or moisture.

The method for measurement of the current level of an alternating current through the use of a current transformer according to the invention particularly achieves the advantage that the ambient temperature can have no undesirable influences on the measurement of the current level.

The method is particularly highly suitable for identification of fault currents, in particular in a line which is part of a railroad track or part of a rail vehicle.

Other features which are considered as characteristic for the invention are set forth in the appended claims.

Although the invention is illustrated and described herein as embodied in a method for measuring the current level of an alternating current, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWING

The drawing is a schematic and block diagram illustrating one exemplary embodiment of a method for measuring a current level of an alternating current through the use of a current transformer.

DETAILED DESCRIPTION OF THE INVENTION

Referring now in detail to the single FIGURE of the drawing, there is seen a line 1 in which a fault current can occur. A current transformer 2, which has a measurement winding 3 and a test winding 4, is used to identify a fault current. Both windings are connected to a fault current monitoring module 5. In order to overcome the temperature dependency of the current level induced in the measurement winding 3, the voltage on the test winding 4 is measured through a voltage tap 6. A known resistor 7, which is inserted into the circuit of the test winding and across which the voltage drop is measured, in then used to determine the current level in the test winding 4. Both the voltage tap 6 and the resistor 7 are connected through data lines 8 to an evaluation unit 9 within the fault current monitoring module 5. The electrical resistance of the test winding 4, which is correlated with the outside temperature, is determined from the current level and the voltage. Laboratory measurements of the electrical resistances are carried out at different temperatures in order to determine this correlation function. The instantaneous outside temperature is determined from the measured electrical resistance through the use of this function. A value for the instantaneous outside temperature is therefore available in the evaluation unit 9, and is used to determine a threshold value. A function determined in laboratory measurements is also used for this purpose, indicating a dependency of the current level of the threshold value on the temperature. It is only if this threshold value is exceeded that the current level measured by the measurement winding is considered, and the evaluation unit 9 activates a switching apparatus 10 which opens a switch 11 in the line 1. The line 1 is thus interrupted. Outside temperature influences are thus advantageously taken into account in the identification of a fault current according to the invention.

By way of example, the threshold value is increased when the outside temperature is relatively low, because the contact between the wheels and the rails is generally poorer when the temperature is relatively low than at a higher temperature, as a result of which discrepancies can occur in the current level in the measurement winding 3 which are not caused by a fault current.

The invention claimed is:

1. A method for measuring a current level of an alternating current in an electric line, the method comprising the following steps:
   providing a current transformer including a measurement winding and a test winding;
   measuring a resistance of the test winding;
   determining a temperature of the test winding and therefore of the measurement winding from the resistance of the test winding; and
   correcting a value for a current level in the electric line, measured on the measurement winding, using the determined temperature.

2. The method for measuring the current level of an alternating current according to claim 1, which further comprises:
   feeding an alternating current into the test winding;
   measuring a current level and a voltage of the test winding;
   determining the resistance from the current level and the voltage; and
   determining the temperature from the determined resistance using a known dependency function.

3. The method for measuring the current level of an alternating current according to claim 1, which further comprises:
   comparing the value for the current level measured on the measurement winding with a threshold value depending on the determined temperature; and
   considering the measured current level only if the threshold value is exceeded.

4. The method for measuring the current level of an alternating current according to claim 3, which further comprises determining the dependency of the threshold value on the temperature by using a function determined in laboratory measurements.

5. The method for measuring the current level of an alternating current according to claim 3, which further comprises:
   providing a fault current monitoring module having an evaluation unit; and
   changing the threshold value in the evaluation unit.

6. The method for measuring the current level of an alternating current according to claim 2, which further comprises:
   providing a fault current monitoring module having an integrated resistor; and
   determining the current level of the current through the test winding with the resistor.

7. The method for measuring the current level of an alternating current according to claim 1, wherein the alternating current is a feed current or a return current of a rail vehicle.

8. A method for measuring a current level of an alternating current in an electric line, the method comprising the following steps:
   providing a current transformer including a measurement winding and a test winding;
   measuring a resistance of the test winding;
   determining a temperature of the test winding and therefore of the measurement winding from the resistance of the test winding;
   measuring a value for the current level in the electric line, the value being measured on the measurement winding; and
   correcting the value using the determined temperature.

9. The method for measuring the current level of an alternating current according to claim 8, which further comprises:
   feeding an alternating current into the test winding;
   measuring a current level and a voltage of the test winding;
   determining the resistance from the current level and the voltage; and determining the temperature from the determined resistance using a known dependency function.

10. The method for measuring the current level of an alternating current according to claim 8, which further comprises:
    comparing the value for the current level measured on the measurement winding with a threshold value depending on the determined temperature; and
    considering the measured current level only if the threshold value is exceeded.

11. The method for measuring the current level of an alternating current according to claim 10, which further comprises determining the dependency of the threshold value on the temperature by using a function determined in laboratory measurements.

12. The method for measuring the current level of an alternating current according to claim 10, which further comprises:
    providing a fault current monitoring module having an evaluation unit; and
    changing the threshold value in the evaluation unit.

13. The method for measuring the current level of an alternating current according to claim 9, which further comprises:
    providing a fault current monitoring module having an integrated resistor; and
    determining the current level of the current through the test winding with the resistor.

14. The method for measuring the current level of an alternating current according to claim 8, wherein the alternating current is a feed current or a return current of a rail vehicle.

* * * * *